United States Patent
Saito (10) Patent No.: US 6,333,675 B1
(45) Date of Patent: Dec. 25, 2001

(54) VARIABLE GAIN AMPLIFIER WITH GAIN CONTROL VOLTAGE BRANCH CIRCUIT

(75) Inventor: Shinji Saito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/543,893

(22) Filed: Apr. 6, 2000

(30) Foreign Application Priority Data

Jul. 22, 1999 (JP) .................................................. 11-207646

(51) Int. Cl.$^7$ ............................... H03G 5/16; H03G 9/00
(52) U.S. Cl. ...................... 330/133; 330/134; 455/241.1; 455/251.1; 455/253.1; 455/253.2
(58) Field of Search ................................. 338/133, 134; 455/241.1, 251.1, 253.1, 253.2

(56) References Cited

U.S. PATENT DOCUMENTS 5,841,320 * 11/1998 Ichihara .................................. 330/133
6,011,437 * 1/2000 Sutardja et al. ....................... 330/133

FOREIGN PATENT DOCUMENTS

54100644 * 8/1979 (JP) ....................................... 330/133
9-36679    2/1997 (JP) .

* cited by examiner

Primary Examiner—Michael B. Shingleton
(74) Attorney, Agent, or Firm—Arent Fox Kintner Plotkin & Kahn, PLLC (57) ABSTRACT

A variable gain amplifier includes multiple unit variable gain amplifiers connected in series which amplify an input signal in accordance with their respective gains and generate a multi-stage amplified signal. A gain control circuit generates voltage control signals, one for each of the unit amplifiers, from a gain control input signal. The control signals control the respective gains of the unit amplifiers such that the gain of the first amplifier in the series is greater than the gain of the last amplifier in the series.

8 Claims, 10 Drawing Sheets

VARIABLE GAIN AMPLIFIER WITH GAIN CONTROL VOLTAGE BRANCH CIRCUIT

BACKGROUND OF THE INVENTION

The present invention relates to a variable gain amplifier, and more particularly, to a variable gain amplifier preferably used in communication devices, such as portable telephones.

A variable gain amplifier is used in an automatic gain control (AGC) circuit of a send and receive unit of a portable telephone.

Figure 1:
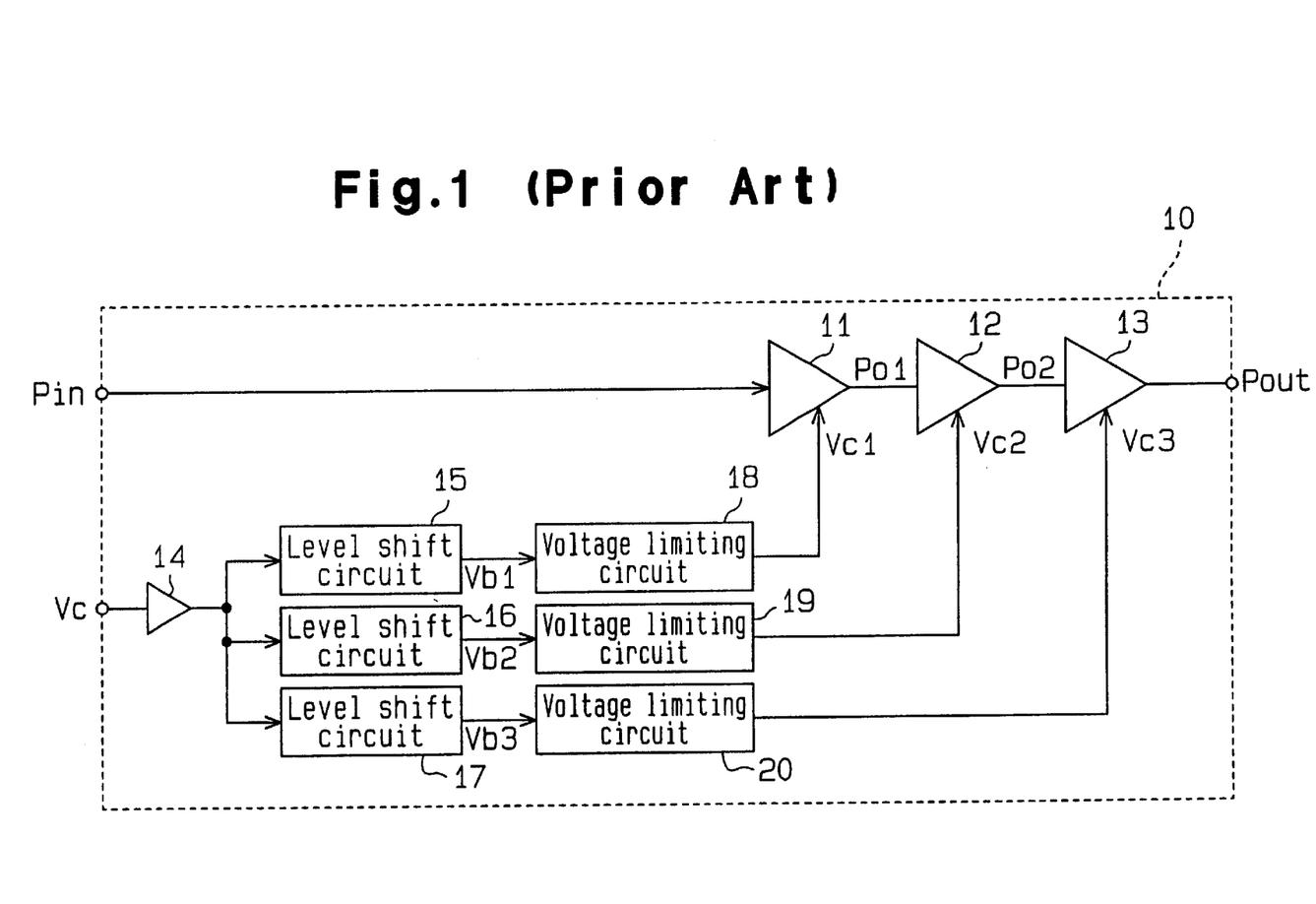
FIG. 1 is a schematic block diagram of a conventional variable gain amplifier.

FIG. 1 is a schematic block diagram of a conventional variable gain amplifier 10. The variable gain amplifier 10 amplifies an input signal Pin while changing its gain in response to a gain control signal (a control input voltage Vc) and generates an output signal Pout. The variable gain amplifier 10 includes a plurality of (three in this case) unit variable gain amplifiers (hereinafter referred to as "unit amplifiers") 11, 12 and 13, a direct current (DC) amplifier 14 for producing a signal used to control respective gains in response to the control input voltage Vc, level shift circuits 15, 16 and 17 and voltage-limiting circuits 18, 19 and 20.

The DC amplifier 14 provides an amplified signal generated by amplifying the control input voltage Vc to each of the level shift circuits 15, 16 and 17. The level shift circuits 15, 16 and 17 level-shift the amplified signal by a predetermined DC voltage and generate level shifted voltages Vb1, Vb2 and Vb3, respectively. The voltage-limiting circuits 18, 19 and 20 limit the level shifted voltages Vb1, Vb2 and Vb3 from the level shift circuits 15, 16 and 17 to a constant DC voltage range and provide the limited control voltages Vc1, Vc2 and Vc3 to the unit amplifiers 11, 12 and 13, respectively.

Figure 2A:
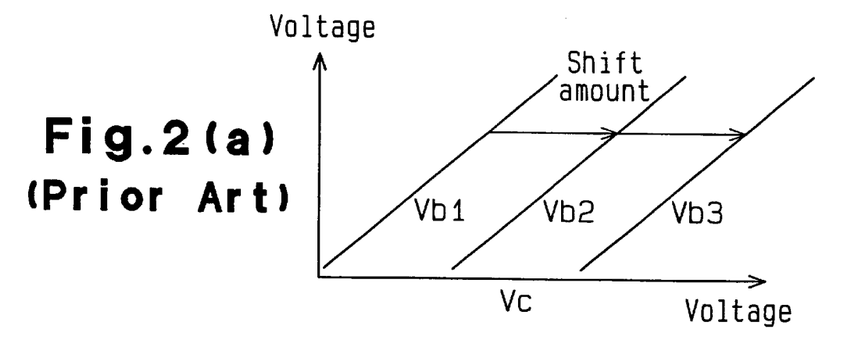
FIG. 2(a) is a graph showing the relationships between a control input voltage and voltages of level shift circuits of the variable gain amplifier of FIG. 1.
Figure 2B:
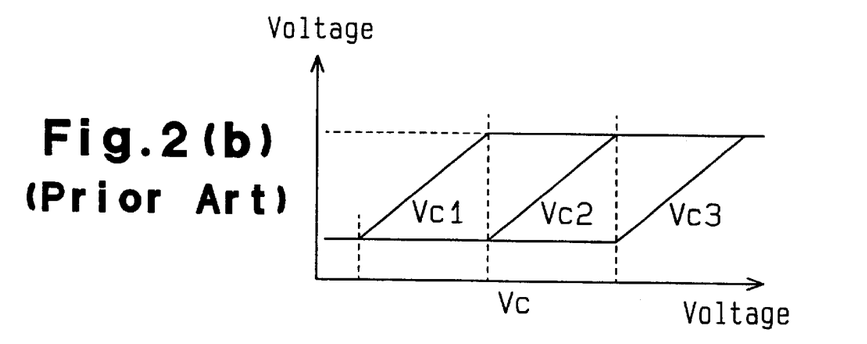
FIG. 2(b) is a graph showing the relationships between the control input voltage and control voltages of voltage-limiting circuits of the variable gain amplifier of FIG. 1.

FIG. 2(a) is a graph showing the relationships between the control input voltage Vc and the voltages Vb1, Vb2 and Vb3 of the level shift circuits 15, 16 and 17, and FIG. 2(b) is a graph showing the relationships between the control input voltage Vc and the control voltages Vc1, Vc2 and Vc3 of the voltage-limiting circuits 18, 19 and 20.

Figure 2C:
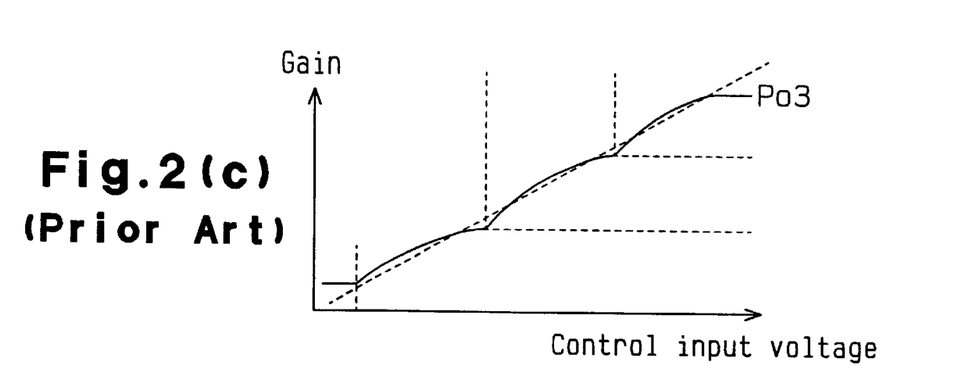
FIG. 2(c) is a graph showing the relationships between the control input voltage and a gain of the variable gain amplifier of FIG. 1.

When the control voltages Vc1, Vc2 and Vc3 are generated, the unit amplifiers 11, 12 and 13 sequentially perform amplification operations together with the increase of the control input voltage Vc. As shown in FIG. 2(c), the variable gain amplifier 10 outputs the amplified signal having a substantially linear gain characteristic against the change of the control input voltage Vc.

However, in the high gain region (region where the control input voltage Vc approaches the maximum value), the noise factor of the conventional variable gain amplifier 10 increases. This is because the gains of the unit amplifiers 11 to 13 are limited in order to obtain the substantially linear gain characteristic of the variable gain amplifier 10. Thus, when the gain of the first unit amplifier 11 is increased to reduce the noise factor, the gain linearity deteriorates, and the noise factor deteriorates when the gain of the unit amplifier 11 is suppressed to improve the linearity.

Figure 3A:
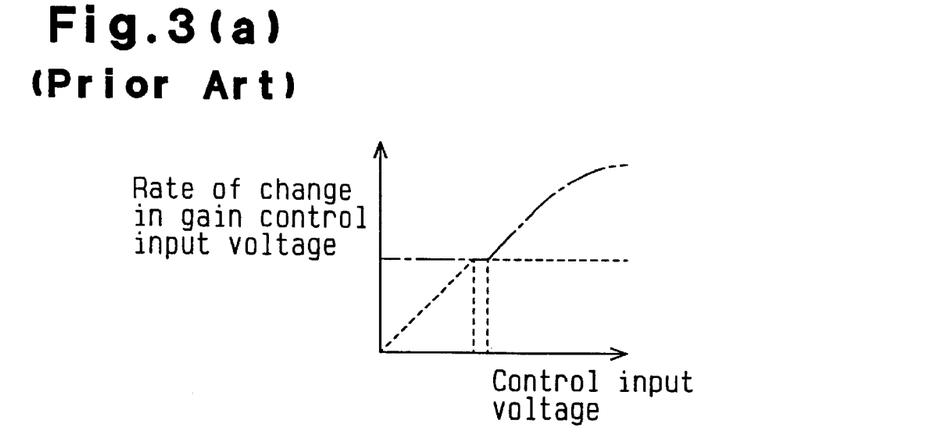
FIG. 3(a) to FIG. 3(c) are graphs showing the relationships between the rate of change of the control input voltage and the control input voltage.
Figure 3B:
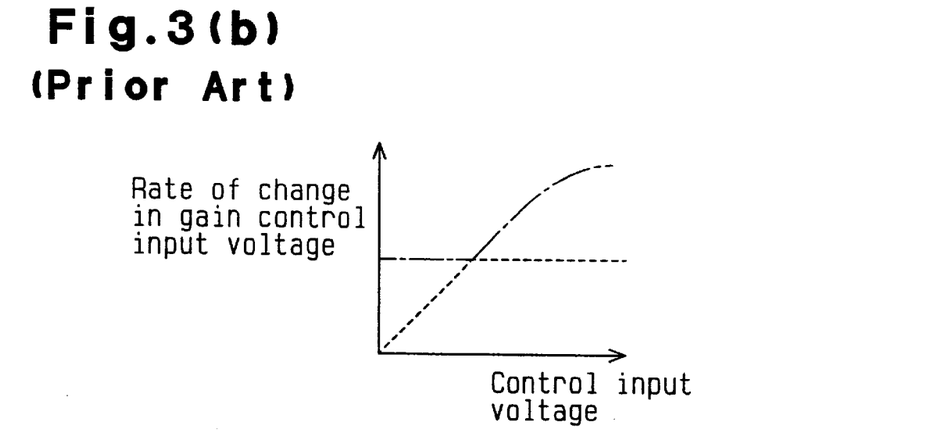
Figure 3C:
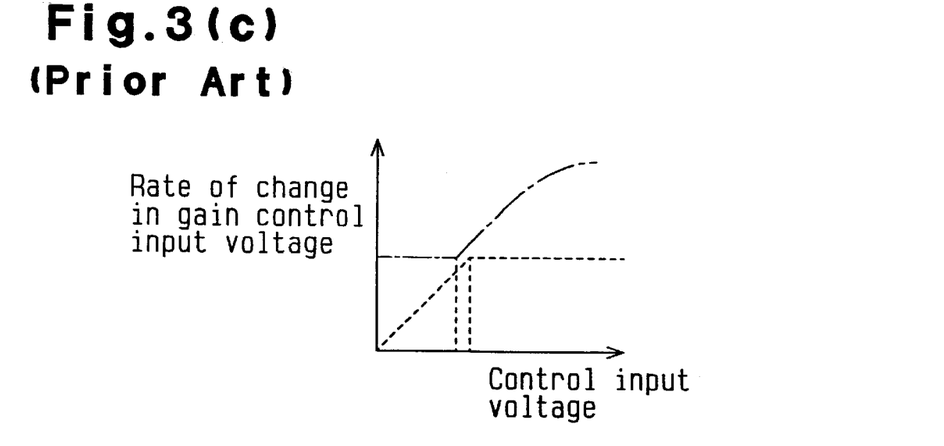

Further, because each of the level shift circuits 15 to 17 level-shifts the input signal separately and generates the voltages Vb1 to Vb3, the switching timing of the unit amplifiers 11 to 13 is shifted as shown in FIG. 3(a) or FIG. 3(c) if the shift amount of each of the level shift circuits 15 to 17 is changed by process irregularities. FIG. 3(b) shows ideal switching timing. This impedes the linearity of gain characteristic. Further, when the limit values of the voltage-limiting circuits 18 to 20 have dispersion due to the process irregularities, the linearity of the gain characteristic is not adequate.

SUMMARY OF THE INVENTION

The object of the present invention is to provide a variable gain amplifier having an improved linear gain characteristic and a low noise factor.

In one aspect of the present invention, a variable gain amplifier includes a plurality of series connected unit variable gain amplifiers including a front stage amplifier and a back stage amplifier, for amplifying an input signal in accordance with respective gains and generating a multi-stage amplified signal. A gain control circuit is connected to the plurality of unit variable gain amplifiers to generate control signals which control the respective gains of the unit variable gain amplifiers in accordance with a gain control input signal so that the gain of the front stage amplifier is greater than that of the back stage amplifier.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 4:
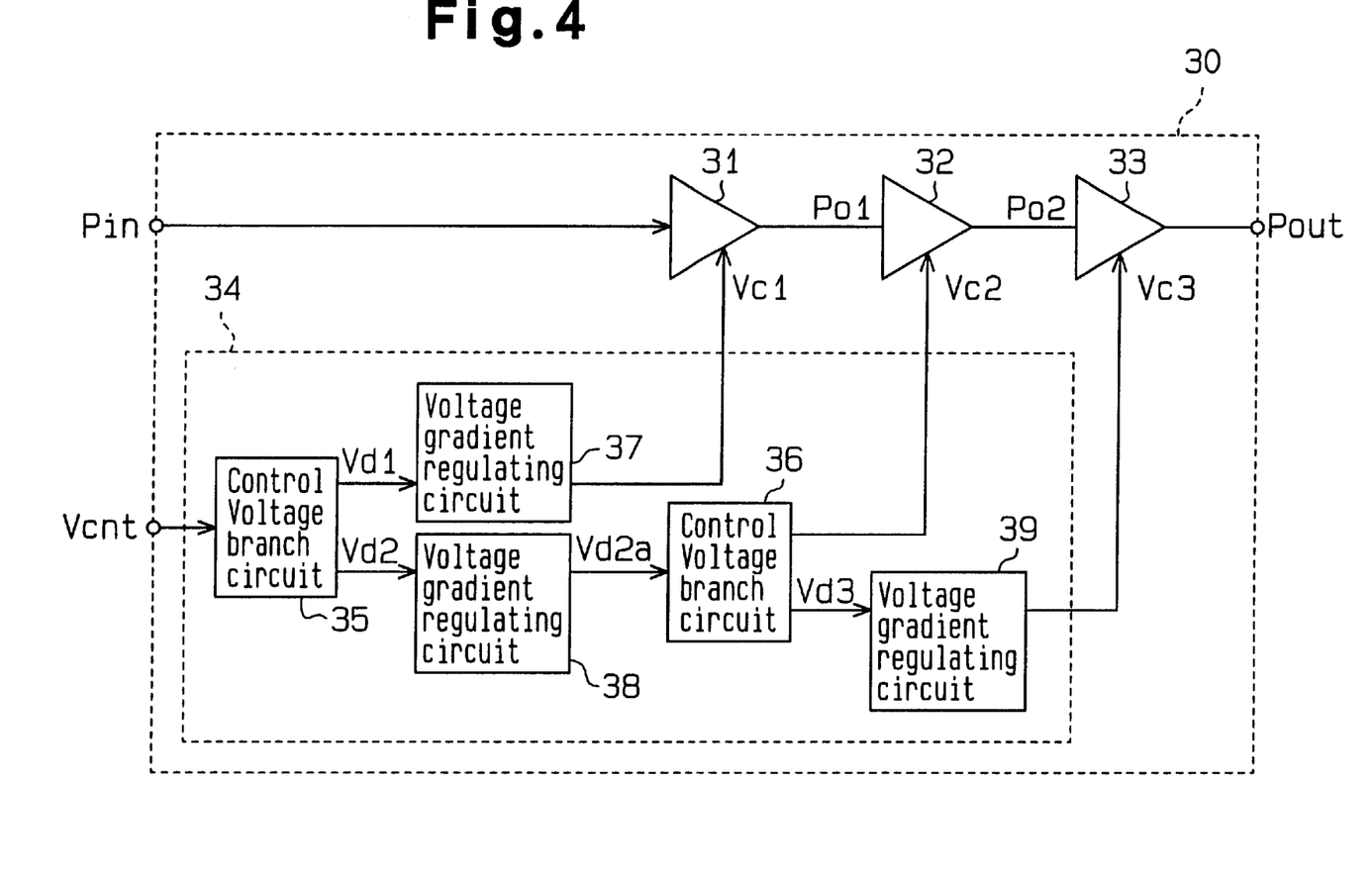
FIG. 4 is a schematic block diagram of a variable gain amplifier according to a first embodiment of the present invention.

FIG. 4 is a schematic block diagram of a variable gain amplifier 30 according to a first embodiment of the present invention.

The variable gain amplifier 30 includes a plurality of (three in this embodiment) unit variable gain amplifiers (hereinafter referred to as "unit amplifiers") 31, 32 and 33 connected in series and a gain control unit 34 which controls the gains of the unit amplifiers 31–33.

The gain control unit 34 causes a gain control signal (a control input voltage Vcnt) to branch at control voltages Vc1, Vc2 and Vc3 for the unit amplifiers 31–33. The first unit amplifier 31 receives an input signal Pin and amplifies the input signal Pin while changing its gain in accordance with the control voltage Vc1. The second and third unit amplifiers 32, 33 amplify input signals Po1, Po2 while changing their gains in accordance with the control voltages Vc2, Vc3, respectively. That is, the variable gain amplifier 30 amplifies the input signal Pin while changing the gain (the total gain of the unit amplifiers 31–33) in response to the control input voltage Vcnt and generates an output signal Pout.

Specifically, the gain control unit 34 provides the first control voltage Vc1 to the first unit amplifier 31 so that the gain of the first unit amplifier 31 varies in the relatively low gain region. As the gain region is shifted from low to high, the gain control unit 34 generates the control voltage Vc2 so that the gain is distributed to the second unit amplifier 32. Further, the gain control unit 34 generates the control voltages Vc2 and Vc3 so that the gain is distributed to the second and third unit amplifiers 32 and 33 when the gain region is shifted to a higher gain region. The gain control unit 34 adjusts the gain distribution(i.e, the gain changing rate) in the high gain region so that the gain of the unit amplifier 31 (or 32) is greater than that of the unit amplifier 32 (or 33). The gain control unit 34 determines the distribution timing of the gains to the unit amplifiers 31 to 33 in accordance with switching voltages Vs1 and Vs2, as shown in FIG. 5(a) to FIG. 5(c).

Figure 5A:
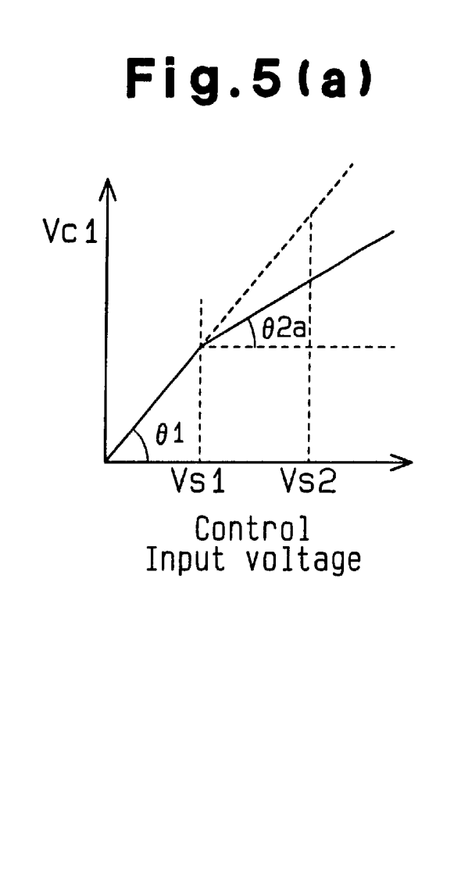
FIG. 5(a) to FIG. 5(c) are graphs showing the relationships between control voltages and a control input voltage of the variable gain amplifier of FIG. 4.
Figure 5B:
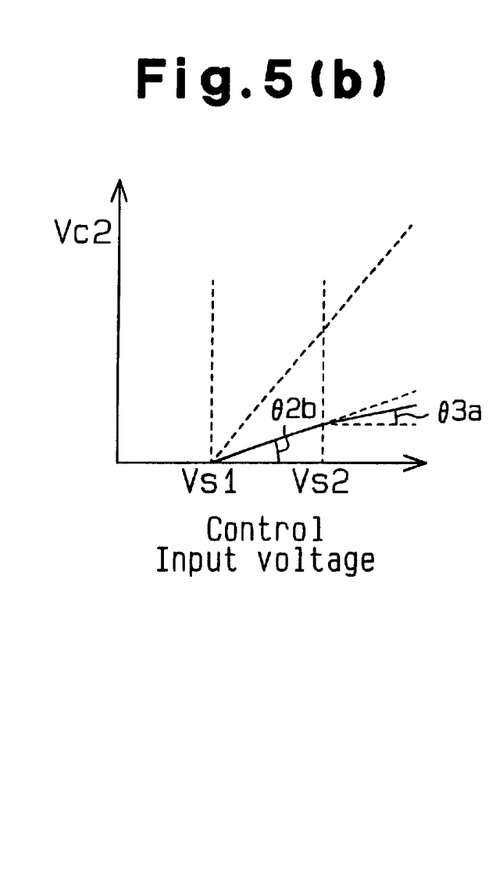
Figure 5C:
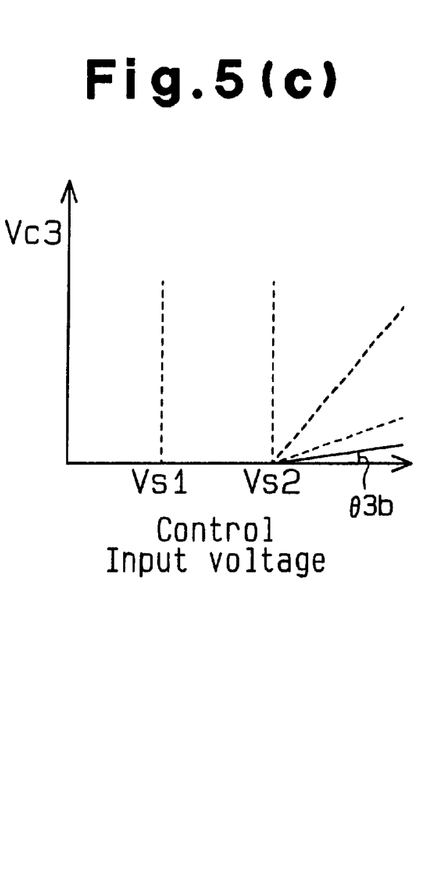
Figure 6A:
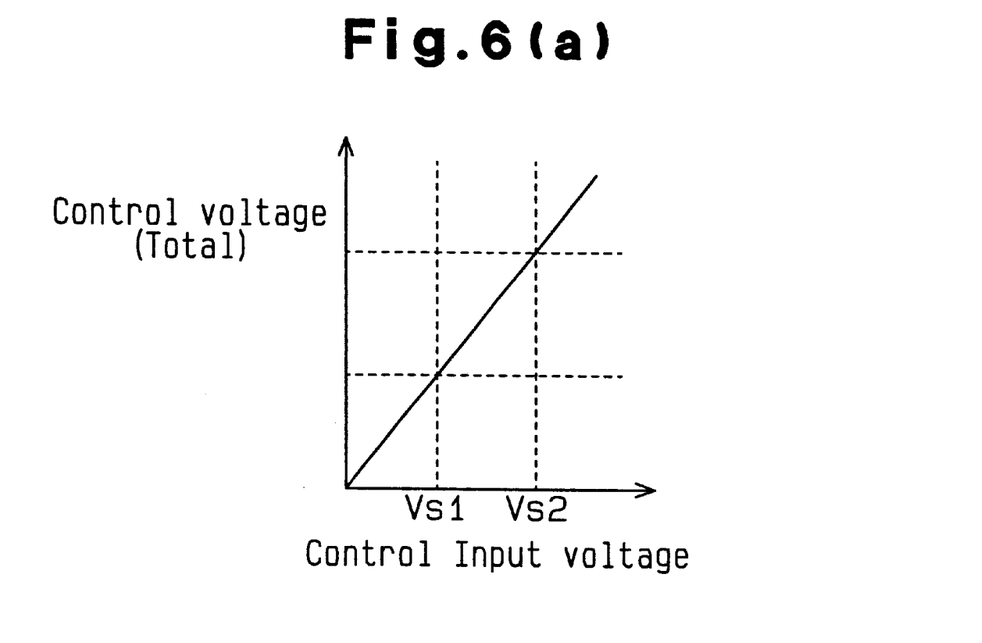
FIG. 6(a) is a graph showing the relationship between the total control voltage and the control input voltage of the variable gain amplifier of FIG. 4.
Figure 6B:
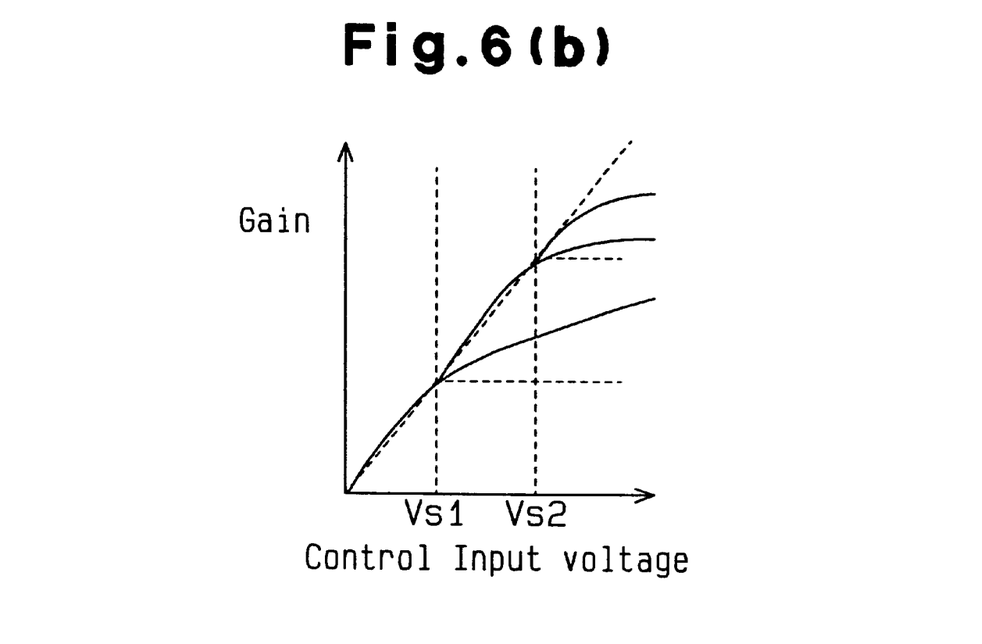
FIG. 6(b) is a graph showing the relationship between the control input voltage and a gain of the variable gain amplifier of FIG. 4.

FIG. 5(a) to FIG. 5(c) are graphs showing the relationships between each of the control voltages Vc1, Vc2 and Vc3 and the control input voltage Vcnt. FIG. 6(a) is a graph showing the relationship between the control input voltage Vcnt and the total of each of the control voltages Vc1, Vc2 and Vc3, and FIG. 6(b) is a graph showing the relationship between the gain and the control input voltage Vcnt.

Referring to FIG. 5(a), when the control input voltage Vcnt is less than the first switching voltage Vs1, the gain control unit 34 provides the first control voltage Vc1 having a predetermined variation against the input voltage Vcnt, to the first unit amplifier 31. The variation of the first control voltage Vc1 (gradient $\theta1$ of a straight line showing the first control voltage Vc1) against the control input voltage Vcnt is called the changing rate of the first control voltage Vc1, and this changing rate corresponds to the changing rate of the gain of the first unit amplifier 31. Thus, the first unit amplifier 31 amplifies the input signal Pin in accordance with the change of first control voltage Vc1 and generates an output signal Po1.

When the control input voltage Vcnt is greater than the first switching voltage Vs1, the gain control unit 34 adjusts the gradient(variation) of the first and second control voltages Vc1 and Vc2 to distribute the total gain to the first and second unit amplifiers 31 and 32. That is, as shown in FIG. 5(a), the gain control unit 34 changes the gradient (angle $\theta1$) of the first control voltage Vc1 to an angle $\theta2a$ and changes the gradient of the second control voltage Vc2 to a smaller angle $\theta2b$ ($\theta1-\theta2a$) than that of the first control voltage Vc1.

When the control input voltage Vcnt is greater than the second switching voltage Vs2, the gain control unit 34 adjusts the gradient(variation) of the first to third control voltages Vc1 to Vc3 to distribute the total gain to the first and second unit amplifiers 31 and 32 and distribute the gain of the second unit amplifier 32 to the second and third unit amplifiers 32 and 33. That is, as shown in FIG. 5(b), the gain control unit 34 changes the gradient (angle $\theta2b$) of the second control voltage Vc2 to an angle $\theta3a$ and changes the gradient of the third control voltage Vc3 to a smaller angle $\theta3b$ ($\theta2b-\theta3a$) than that of the second control voltage Vc2.

The gain control unit 34 causes a gain changing rate to branch at the three gain changing rates of the unit amplifiers 31 to 33 so that the front stage unit amplifier 31 (or 32) has a gain greater than the back stage unit amplifier 32 (or 33), as shown in FIGS. 5(a)–5(c). Accordingly, because the front stage unit amplifier 31 operates at high gain/low noise, the noise factor in the variable gain amplifier 30 is reduced.

Further, the gain control unit 34 causes the control input voltage Vcnt to branch at the first to third control voltages Vc1 to Vc3 and switches each of the control voltages Vc1 to Vc3 in accordance with the predetermined switching voltages Vs1 and Vs2. Accordingly, the deterioration of linearity caused by process irregularities is prevented. Furthermore, even if the switching voltages Vs1 and Vs2 (i.e., the gain changing rate of the unit amplifiers 31 to 33) fluctuate due to process irregularities, the total gain is fixed and a good linearity gain characteristic is obtained.

The gain control unit 34 switches the unit amplifiers 31 to 33 such that the gains overlap in a predetermined voltage area of the control input voltage.

Figure 7A:
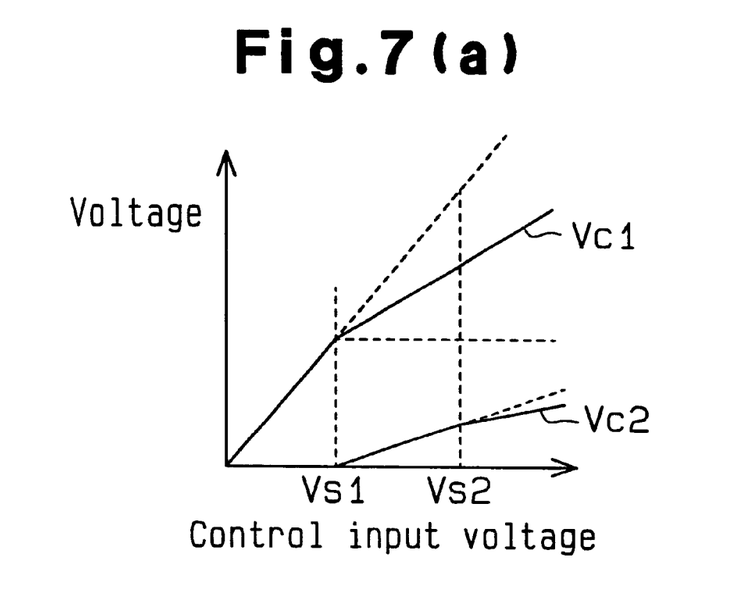
FIG. 7(a) is a graph showing the relationships between the control voltages and the control input voltage of the variable gain amplifier of FIG. 4.
Figure 7B:
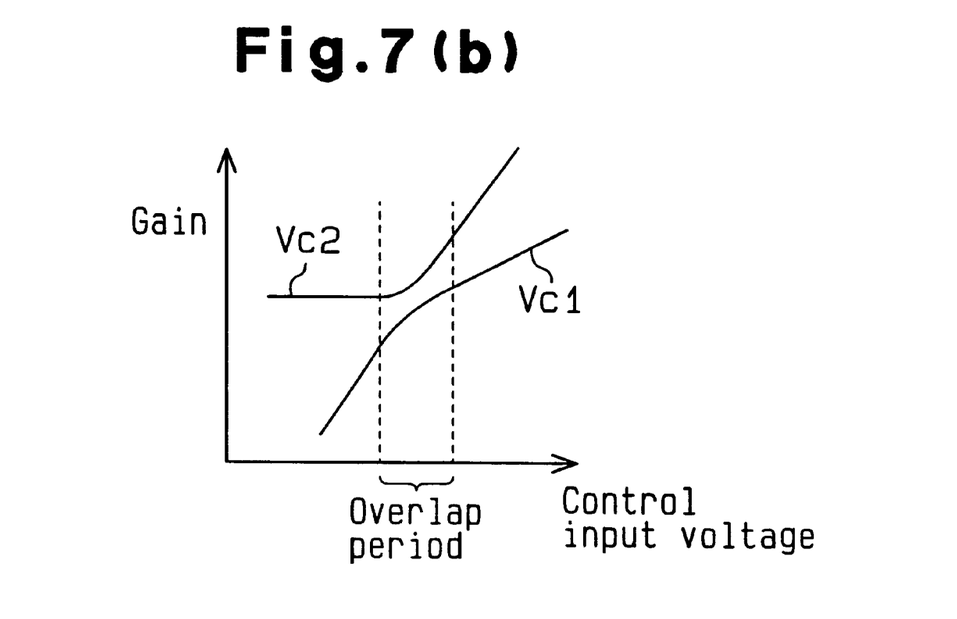
FIG. 7(b) is a graph showing the relationships between the control input voltage and the gain of the variable gain amplifier of FIG. 4.

Specifically, as shown in FIG. 7(a), when the rate of change of the first control voltage Vc1 (gradient of a characteristic line segment) is changed from the first gradient to the second gradient at the first switching voltage Vs1, the gain control unit 34, as shown in FIG. 7(b), slowly reduces the gradient of the first control voltage Vc1. On the contrary, the gain control unit 34 slowly increases the gradient of the second control voltage Vc2. The gain control unit 34 controls the total rate of change of the first and second control voltages Vc1 and Vc2 in this overlapping region to a constant rate of change. That is, the gain control unit 34 compensates the gain variation of the first control voltage Vc1 by the gain variation of the second control voltage Vc2.

The gain control unit 34 includes control voltage branch circuits (hereinafter simply referred to as "branch circuits") 35 and 36 and voltage gradient regulating circuits (hereinafter simply referred to as "regulating circuits") 37, 38 and 39.

The first branch circuit 35 causes the control input voltage Vcnt to branch at first and second branch voltages Vd1 and Vd2, which are provided to the first and second regulating circuits 37 and 38, respectively.

Specifically, when the control input voltage Vcnt is less than the first switching voltage Vs1, the first branch circuit 35 generates the first branch voltage Vd1 having the same value as the control input voltage Vcnt. When the control input voltage Vcnt is grater than the first switching voltage Vs1, the first branch circuit 35 generates the first and second branch voltages Vd1 and Vd2 each having a value that is half of the control input voltage Vcnt.

The regulating circuit 37 amplifies or attenuates the first branch voltage Vd1 and generates the first control voltage Vc1, which is provided to the first unit amplifier 31.

The second regulating circuit 38 amplifies or attenuates the second branch voltage Vd2 and generates a regulated voltage Vd2a, which is provided to the second branch circuit 36.

The second branch circuit 36 causes the regulated voltage Vd2a to branch at the second control voltage Vc2 and a third branch voltage Vd3. The second control voltage Vc2 is provided to the second unit amplifier 32 and the third branch voltage Vd3 is provided to the third regulating circuit 39.

When the input voltage Vd2a is less than the predetermined voltage (i.e., the voltage generated by dividing the second switching voltage Vs2 at a predetermined branch ratio of the second branch circuit 36), the second branch circuit 36 generates the second control voltage Vc2 having the same value as the regulated voltage Vd2a. When the input voltage Vd2a is greater than the predetermined voltage, the second branch circuit 36 generates the second control voltage Vc2 and the third branch voltage Vd3 each having a value of half of the regulated voltage Vd2a.

The third regulating circuit 39 amplifies or attenuates the third branch voltage Vd3 and generates the third control voltage Vc3, which is provided to the third unit amplifier 33.

The first and second branch circuits 35 and 36 and the first to third regulating circuits 37 to 39 are specifically described with reference to FIG. 8.

The first branch circuit 35 comprises a resistor R1 and a diode D1 connected in series. The control input voltage Vcnt is supplied to the first terminal of the resistor R1, the second terminal of the resistor R1 is connected to the anode of the diode D1 and the cathode of the diode D1 is connected to a low potential power supply(a ground).

The diode D1 turns off when the control input voltage Vcnt is less than its own forward voltage and turns on when it is greater than the forward voltage. When the diode D1 is off, the control input voltage Vcnt is supplied to the first regulating circuit 37 via the resistor R1 as the first branch voltage Vd1.

When the diode D1 is turned on, a current flows to the ground from the node between the diode D1 and resistor R1, thereby generating a current through the resistor R1 and thus generating a potential difference between the first and second terminals of the resister R1. As a result, the first branch voltage Vd1 is generated by dividing the control input voltage Vcnt in accordance with the resistor R1 and the diode D1 ON-state resistance. The second branch voltage Vd2 corresponds to the potential difference between the first and second terminals of the resistor R1. That is, the forward voltage of the diode D1 is set as the first switching voltage Vs1 and the ratio of the resistor R1 and the diode D1 ON-state resistance is set as a branch ratio of the control input voltage Vcnt.

The first regulating circuit 37 comprises an operational amplifier OPA1 and resistors R2 and P3. The first branch voltage Vd1 is supplied to the non-inverting input terminal of the operational amplifier OPA1. An inverting input terminal of the operational amplifier OPA1 is connected to an output terminal via the resistor R2 and also to a ground via the resistor R3. The first regulating circuit 37 operates as a non-inverting amplifier and amplifies (or attenuates) the first branch voltage Vd1 in accordance with the resistance values of the resistors R2 and R3 to generate the first control voltage Vc1.

The second regulating circuit 38 comprises an operational amplifier OPA2 and resistors R4, R5, R6 and R7. The inverting input terminal of the operational amplifier OPA2 is connected to an output terminal via the resistor R4 and also to the node between the resistor R1 and the diode D1 of the first branch circuit 35 via the resistor R5. The non-inverting input terminal of the operational amplifier OPA2 is connected to the first terminal of the resistor R1 via the resistor R6 and also to a ground via the resistor R7.

The second regulating circuit 38 operates as a differential amplifier and amplifies (or attenuates) the second branch voltage Vd2 in accordance with the resistance values of the resistors R4 to R7 to generate the regulated voltage Vd2a.

The second branch circuit 36 comprises a resistor R8 and two diodes D2 and D3 connected in series. The regulated voltage Vd2a is supplied to the first terminal of the resistor R8 and the second terminal of the resistor R8 is connected to a ground via the diodes D2, D3. When the regulated voltage Vd2a is less than the total values of the forward voltages of the diodes D2 and D3, the second branch circuit 36 generates the second control voltage Vc2 having the same value as the regulated voltage Vd2a. When the regulated voltage Vd2a is greater than that total value, the second branch circuit 36 generates the second control voltage Vc2 by dividing the regulated voltage Vd2a by the resistor R8 and the total values of the ON-state resistance of the diodes D2 and D3 and generates the third branch voltage Vd3 corresponding to the potential difference between the first and second terminals of the resistor R8.

The third regulating circuit 39 like the regulating circuit 38, is a differential amplification circuit comprising an operational amplifier OPA3 and resistors R9, R10, R11 and R12. The third regulating circuit 39 amplifies (or attenuates) the third branch voltage Vd3 in accordance with the values of the resistors R9 to R12 to generate the third control voltage Vc3.

Figure 8:
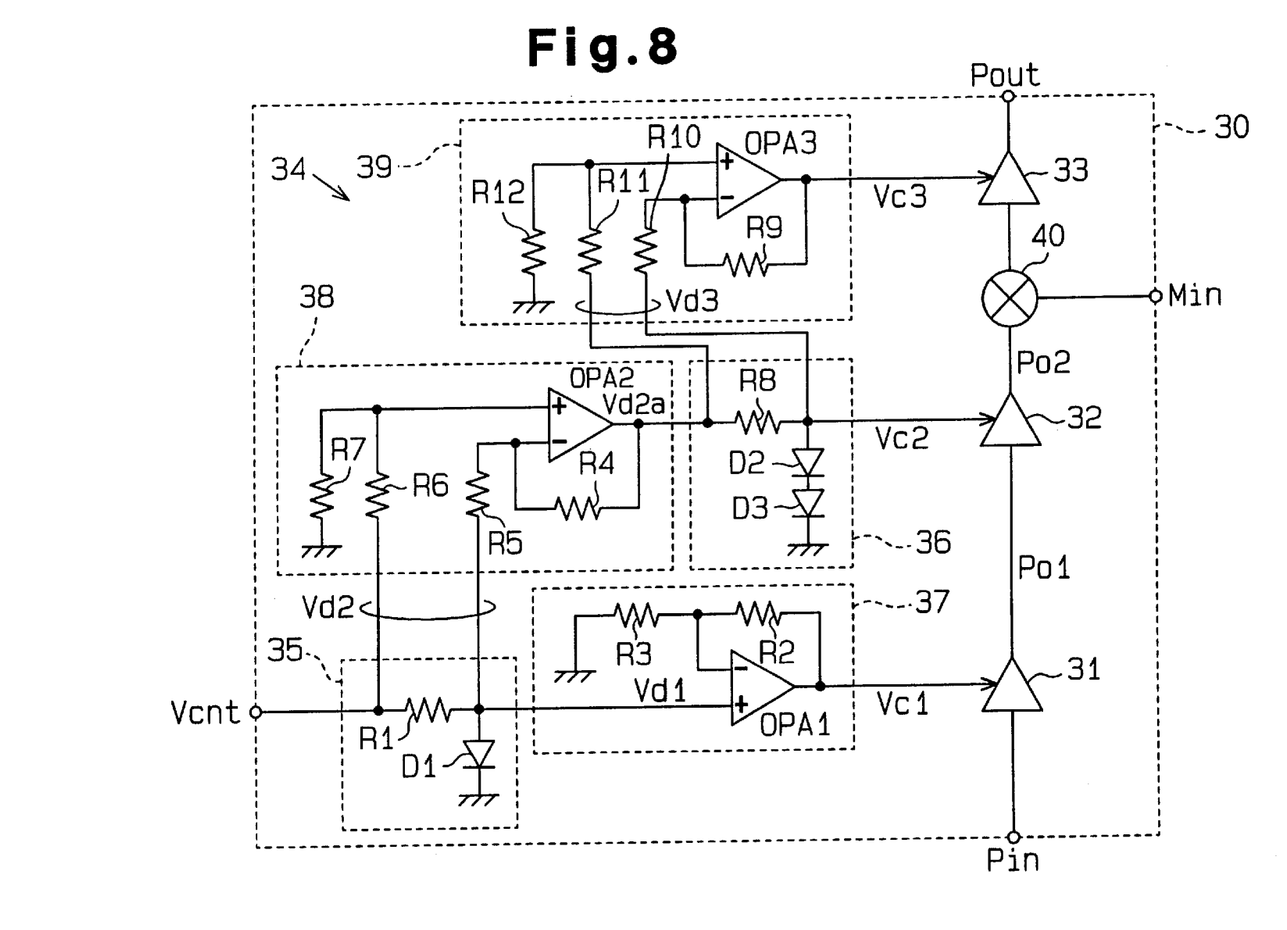
FIG. 8 is a schematic circuit diagram of the variable gain amplifier of FIG. 4.

In FIG. 8, a mixer circuit 40 is connected between the second unit amplifier 32 and the third unit amplifier 33. The mixer circuit 40 receives the output signal Po2 of the second unit amplifier 32 and a local oscillation frequency signal Min. The variable gain amplifier 30 operates as an up converter or a down converter using the input signal Pin and the frequency signal Min.

The first embodiment of the present invention has the following advantages.

(1) The gain control unit 34 causes the control input voltage (gain control signal) Vcnt to branch at or generate the first to third control voltages Vc1 to Vc3 and controls the first to third control voltages Vc1 to Vc3 so that the gain of the front stage unit amplifier 31 (or 32) is greater the back stage unit amplifier 32 (or 33). As a result, a substantially linear gain characteristic is obtained and the noise factor of a multi-stage amplifier is reduced.

(2) When the control input voltage Vcnt exceeds the predetermined switching voltage Vs1, the gain control unit 34 causes the control voltage Vc1 to branch at the first and second control voltages Vc1 and Vc2, which are supplied to the first and second unit amplifiers 31 and 32, respectively. When the control input voltage Vcnt exceeds the predetermined switching voltage Vs2, the gain control unit 34 causes the second control voltage Vc2 to branch at the second and third control voltages Vc2 and Vc3, which are supplied to the second and third unit amplifiers 32 and 33, respectively. This enables the switching timing of the unit amplifiers 31 to 33 to match the branch timing, thereby improving the linear gain characteristic.

(3) The gain control unit 34 generates the control voltages Vc1 to Vc3 such that they overlap each other in a predetermined area of the control input voltage. Further, at the switching timing of the unit amplifiers, the control voltage Vc2 (or Vc3) is corrected by the control voltage Vc1 (or Vc2), and the linearity of the total gain characteristic is improved.

It should be apparent to those skilled in the art that the present invention may be embodied in many other specific forms without departing from the spirit or scope of the invention. Particularly, it should be understood that the invention may be embodied in the following forms.

One or more variable gain amplifiers, which is controlled in the conventional manner, may be connected in series to the unit amplifiers 31 to 33. Further, two of the three unit amplifiers 31 to 33 may be controlled in the conventional manner.

The second branch circuit 36 may be connected between the first voltage branch circuit 35 and the second regulating circuit 38. Further, the first regulating circuit 37 may be connected before the first voltage branch circuit 35.

Figure 9:
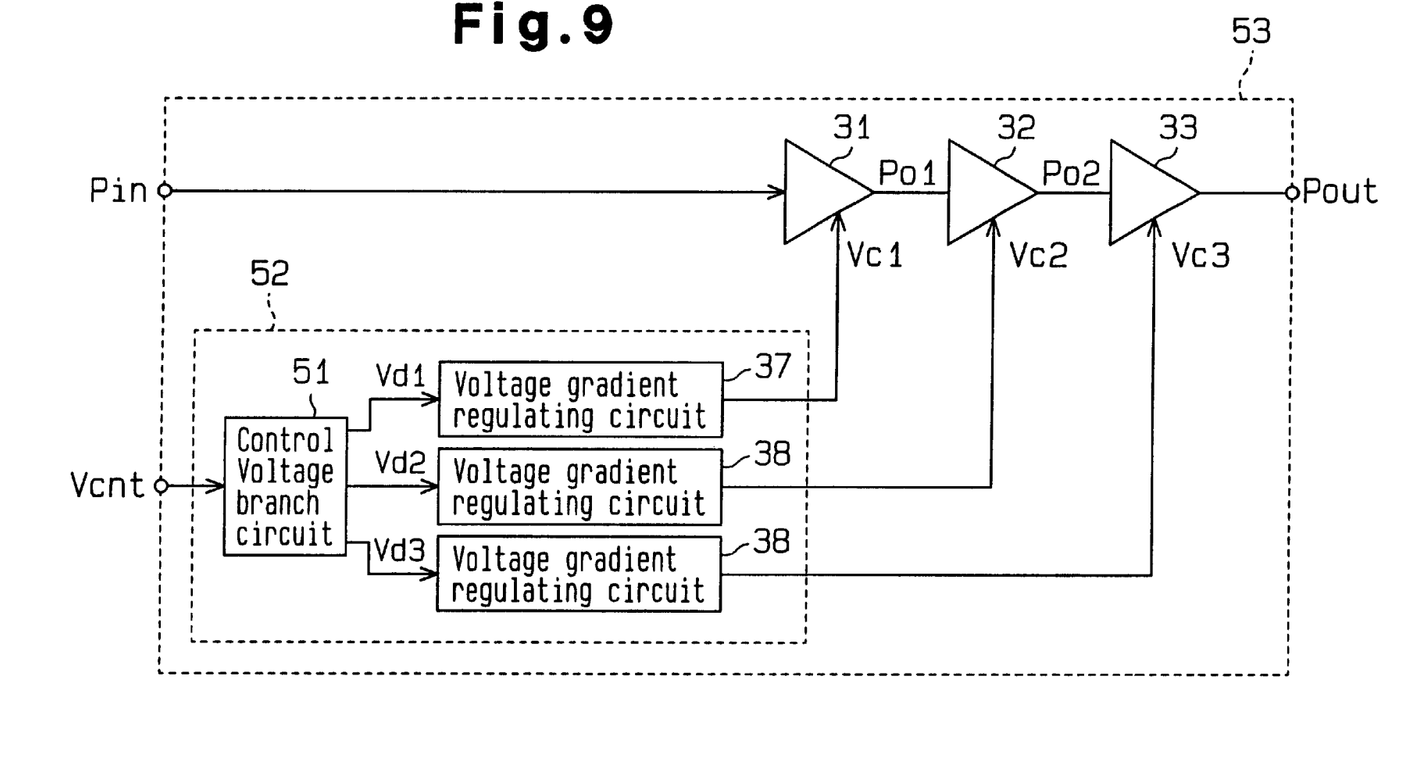
FIG. 9 is a schematic block diagram of a variable gain amplifier according to a second embodiment of the present invention.

As shown in FIG. 9, a gain control unit 52 including a branch circuit 51, which generates the first to third branch voltages Vd1 to Vd3, and first to third voltage gradient regulating circuits 37 to 38 may be used.

Figure 10:
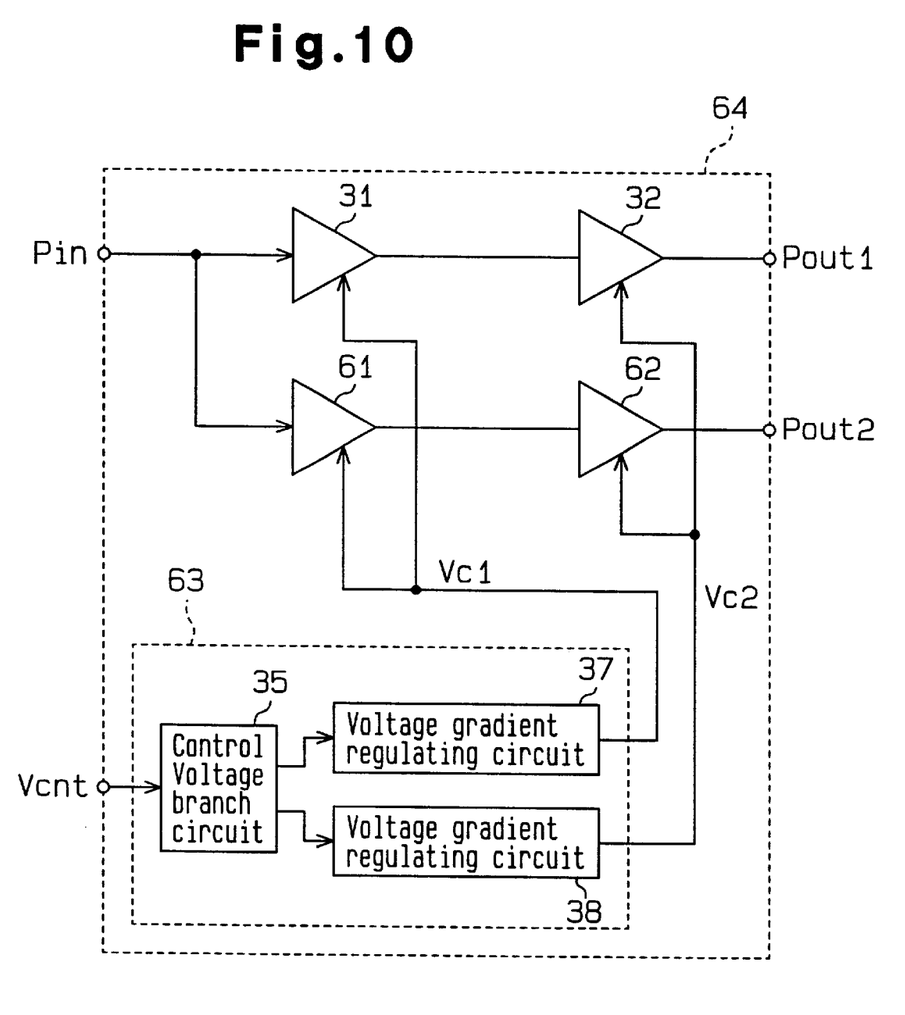
FIG. 10 is a schematic block diagram of a variable gain amplifier according to a third embodiment of the present invention.

As shown in FIG. 10, the present invention may be adapted to a variable gain amplifier 64 including unit amplifiers 61 and 62 connected in parallel to the unit amplifiers 31 and 32. In this case, the first control voltage Vc1 from the first regulating circuit 37 is supplied to the unit amplifiers 31 and 61 and the second control voltage Vc2 from the second regulating circuit 38 is supplied to the unit amplifiers 32 and 62. The branch circuit 35 causes the control input voltage Vcnt to branch at the first and second branch voltages, which are supplied to the first and second regulating circuits 37, 38, respectively. The unit amplifiers 32 and 62 output first and second output signals Pout1 and Pout2, respectively.

Unit amplifiers may be used which perform amplification in accordance with a control current. In that case, a gain control unit controls control currents so that the gain of the front stage unit amplifier is greater than that of the back stage unit amplifier.

Therefore, the present examples and embodiments are to be considered as illustrative and not restrictive and the invention is not to be limited to the details given herein, but may be modified within the scope and equivalence of the appended claims.

What is claimed is:

1. A variable gain amplifier, comprising:
   a plurality of series connected unit variable gain amplifiers including a front stage amplifier and a back stage amplifier, for amplifying an input signal in accordance with respective gains and generating a multi-stage amplified signal; and
   a gain control circuit, connected to the plurality of unit variable gain amplifiers, for generating control signals which control the respective gains of the unit variable gain amplifiers in accordance with a gain control input signal so that the gain of the front stage amplifier is greater than that of the back stage amplifier, wherein the gain control circuit includes,
   a control voltage branch circuit for causing the voltage of the gain control input signal to branch at a plurality of branch voltage corresponding to the unit variable gain amplifiers, each of the branch voltage having a gradient, and
   a plurality of voltage gradient regulating circuits, connected to the control voltage branch circuit, for regulating the gradients of the plurality of branch voltages to generate the control signals.

2. The variable gain amplifier of claim 1, wherein the gain control circuit causes the gain control input signal to branch at first and second control signals and supplies the first and second control signals to the front and back stage amplifiers, respectively.

3. The variable gain amplifier of claim 1, wherein the gain control circuit generates the control signals having voltages overlapping each other in a predetermined voltage area of the gain control input signal.

4. The variable gain amplifier of claim 3, wherein the gain control circuit generates the control signals so that the voltage of a first one of the control signals is compensated by the voltage of a second one of the control signal in the predetermined voltage area.

5. A variable gain amplifier, comprising:
   a plurality of series connected unit variable gain amplifiers including a front stage amplifier and a back stage amplifier, for amplifying an input signal in accordance with respective gains and generating a multi-stage amplified signal; and
   a gain control circuit, connected to the plurality of unit variable gain amplifiers, for generating control signals which control the respective gains of the unit variable gain amplifiers in accordance with a gain control input signal so that the gain of the front stage amplifier is greater than that of the back stage amplifier, wherein the plurality of unit variable gain amplifiers include three unit variable gain amplifiers and the gain control circuit includes:
   a first control voltage branch circuit for causing the voltage of the gain control input signal to branch at first and second branch voltages;
   a first voltage gradient regulating circuit, connected between the first control voltage branch circuit and the first unit gain amplifier, for regulating a gradient of the first branch voltage to generate a first control signal supplied to the first unit variable gain amplifier;
   a second voltage gradient regulating circuit, connected to the first control voltage branch circuit, for regulating a gradient of the second branch voltage to generate a first gradient regulated signal;
   a second control voltage branch circuit, connected between the second voltage gradient regulating circuit and the second unit variable gain amplifier, for causing the voltage of the first gradient regulated signal to branch at second and third branch voltages, the second branch voltage being provided to the second unit variable gain amplifier as a second control signal; and
   a third voltage gradient regulating circuit, connected between the second control voltage branch circuit and the third unit variable gain amplifier, for regulating the gradient of the third branch voltage to generate a third control signal supplied to the third unit variable gain amplifier.

6. The variable gain amplifier of claim 5, wherein the first control voltage branch circuit includes a first resistor and a first diode connected in series, the anode of the first diode receives the gain control input signal via the first resistor, the first branch voltage is generated at a first node between the first diode and the first resistor, and the second branch voltage is generated as a first potential difference between the terminals of the first resistor, and the second control voltage branch circuit includes a second resister and at least one second diode connected in series, the anode of the second diode is connected to the second voltage gradient regulating circuit and receives the first gradient regulated signal via the second resistor, the second branch voltage is generated at a second node between the second diode and the second resistor, and the third branch voltage is generated as a second potential difference between the terminals of the second resistor.

7. The variable gain amplifier of claim 5, wherein the first control voltage branch circuit performs branching when the voltage of the gain control input signal exceeds a first predetermined voltage and the second control voltage branch circuit performs branching when the voltage of the first gradient regulated signal exceeds a second predetermined voltage which is greater than the first predetermined voltage.

8. The variable gain amplifier of claim 5, wherein the first and second control voltages overlap each other in a first predetermined voltage area of the gain control input signal and the second and third control voltages overlap each other in a second predetermined voltage area of the gain control input signal.

* * * * *